United States Patent
Ku et al.

(10) Patent No.: US 8,321,821 B2
(45) Date of Patent: *Nov. 27, 2012

(54) METHOD FOR DESIGNING TWO-DIMENSIONAL ARRAY OVERLAY TARGETS AND METHOD AND SYSTEM FOR MEASURING OVERLAY ERRORS USING THE SAME

(75) Inventors: Yi Sha Ku, Hsinchu (TW); Hsiu Lan Pang, Baoshan Township, Hsinchu County (TW); Wei Te Hsu, Banqiao (TW); Deh Ming Shyu, Jhunan Township, Miaoli County (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 346 days.

This patent is subject to a terminal disclaimer.

(21) Appl. No.: 12/648,183

(22) Filed: Dec. 28, 2009

(65) Prior Publication Data

US 2011/0131538 A1 Jun. 2, 2011

(30) Foreign Application Priority Data

Dec. 2, 2009 (TW) ................................ 98141102 A (51) Int. Cl.
| | |
|---|---|
| G06F 17/50 | (2006.01) |
| G06F 19/00 | (2006.01) |
| G01R 31/26 | (2006.01) |
| H01L 21/66 | (2006.01) |
| G01J 3/28 | (2006.01) |
| G01B 11/00 | (2006.01) |
| G02B 5/18 | (2006.01) |

(52) U.S. Cl. ................ 716/54; 716/52; 716/53; 716/55; 700/98; 700/120; 700/121; 438/16; 356/328; 356/401; 359/566

(58) Field of Classification Search .................... 716/52, 716/53, 54, 55; 700/98, 120, 121; 438/16; 356/328, 401; 359/566
See application file for complete search history.

(56) References Cited

U.S. PATENT DOCUMENTS

| | | | |
|---|---|---|---|
| 7,061,615 B1 | 6/2006 | Lowe-Webb | |
| 7,230,704 B2 * | 6/2007 | Sezginer et al. | ............. 356/401 |
| 7,283,237 B2 | 10/2007 | Sezginer et al. | |
| 7,430,052 B2 * | 9/2008 | Shyu et al. | .................... 356/636 |
| 7,898,662 B2 * | 3/2011 | Van Der Schaar et al. | ... 356/401 |
| 8,064,056 B2 * | 11/2011 | Van Der Schaar et al. | ... 356/401 |
| 8,223,347 B2 * | 7/2012 | Smilde et al. | ................ 356/614 |
| 2004/0233441 A1 * | 11/2004 | Mieher et al. | ................ 356/401 |
| 2004/0246482 A1 * | 12/2004 | Sezginer et al. | ............. 356/401 |
| 2007/0014015 A1 * | 1/2007 | Liu et al. | ........................ 359/566 |
| 2007/0291269 A1 * | 12/2007 | Van Der Schaar et al. | ... 356/401 |
| 2008/0144050 A1 * | 6/2008 | Shyu et al. | .................... 356/636 |
| 2009/0313589 A1 * | 12/2009 | Hsu et al. | .......................... 716/4 |
| 2010/0007863 A1 * | 1/2010 | Jordanoska | ..................... 355/53 |
| 2010/0265506 A1 * | 10/2010 | Den Boef | ...................... 356/399 |
| 2011/0001978 A1 * | 1/2011 | Smilde et al. | ................ 356/446 |
| 2011/0122496 A1 * | 5/2011 | Van Der Schaar et al. | ... 359/566 |

(Continued)

*Primary Examiner* — Phallaka Kik
(74) *Attorney, Agent, or Firm* — Egbert Law Offices, PLLC (57) ABSTRACT

A method for designing a two-dimensional array overlay target comprises the steps of: selecting a plurality of two dimensional array overlay targets having different overlay errors; calculating a deviation of a simulated diffraction spectrum for each two-dimensional array overlay target; selecting an error-independent overlay target by taking the deviations of the simulated diffraction spectra into consideration; and designing a two dimensional array overlay target based on structural parameters of the error-independent overlay target.

8 Claims, 12 Drawing Sheets

U.S. PATENT DOCUMENTS

2011/0154272 A1* 6/2011 Hsu et al. .................. 716/50
2011/0292365 A1* 12/2011 Cramer et al. ............. 355/67
2011/0320986 A1* 12/2011 Hsu et al. .................. 716/52

* cited by examiner

METHOD FOR DESIGNING TWO-DIMENSIONAL ARRAY OVERLAY TARGETS AND METHOD AND SYSTEM FOR MEASURING OVERLAY ERRORS USING THE SAME

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The disclosure relates generally to a system and method for measuring an overlay error, and more particularly, to a method for designing two-dimensional (2-D) array overlay targets and a method and system for measuring overlay errors using the same.

2. Description of Related Art Including Information Disclosed Under 37 CFR 1.97 and 37 CFR 1.98

Continuing improvements in semiconductor process technology have increased the accuracy required for overlay measurement. According to the ITRS (International Technology Roadmap for Semiconductor) the overlay tolerance in the semiconductor process is about 9 nm for the 45 nm semiconductor process technology to be applied in industry in the year 2010, and the corresponding metrology error budget is only about 0.8 nm. Therefore, due to diffraction limitations and proximity effects, conventional image-based overlay metrology cannot meet the accuracy requirements for the next-generation structural parameter measurement.

Diffraction-based metrology, which is different from image-based overlay metrology and is not influenced by the proximity effects, has high repeatability and reproducibility characteristics and will become an important overlay measurement technology.

An overlay measurement system using diffraction-based metrology technology is comprised of a scatterometer and a program for matching analysis, wherein the analysis technique can be a theoretical model-based method or an empirical model-based method. The theoretical model-based method utilizes electromagnetic theory to simulate a characteristic diffraction spectrum of a grating illuminated by an incident light, and then establishes a theoretical model-based comparison database. The characteristic diffraction spectrum is varied using different geometrical parameters (line widths, sidewall angles, thicknesses, overlay errors, etc.) and different optical characteristic parameters (refraction indexes, extinction coefficient properties, etc.) of the grating. In practice, the parameters such as line widths, thickness, sidewall angles and overlay errors are typically strongly correlated, and any incorrect parameter will result in incorrect overlay calculation. U.S. Pat. No. 7,283,237 discloses an optical measurement system using a theoretical model-based method to establish a comparison database. However, the designed 2-D grating is not able to easily isolate the changes induced by the error in the X direction from the error in the Y direction.

The empirical model-based method compares measured data with an empirical regression line, which approximates the data obtained and analyzed by measuring the diffraction spectra formed by a series of at least four gratings having different overlay deviation patterns. These gratings are fabricated on a wafer. The advantage of this method is that it does not require a lot of simulation for setting up a matching database, and therefore there is no strong correlation problem between the parameters. However, one disadvantage of this method is that many gratings must be fabricated and measured on a semiconductor wafer for gathering the library data, which requires a lot of time.

BRIEF SUMMARY OF THE INVENTION

The present disclosure provides a method for designing a 2-D array overlay target, and a method and system for measuring an overlay error. In one aspect, the present disclosure can eliminate strong correlation problems among structural parameters, so as to achieve a sensitive measurement for measuring an overlay error. In another aspect, the disclosure reduces the work of fabricating overlay targets on a semiconductor wafer and measuring the diffraction spectrum formed by the gratings.

A method for designing a 2-D array overlay target according to an embodiment of the present disclosure is disclosed. First, a plurality of 2-D array overlay targets having different overlay errors are selected. Then, a deviation of a simulated diffraction spectrum for each 2-D array overlay target is calculated. Next, an error-independent overlay target is selected by taking the deviations of the simulated diffraction spectra into consideration. Finally, a 2-D array overlay target is designed based on structural parameters of the error-independent overlay target.

A method for measuring an overlay error according to another embodiment of the present disclosure is disclosed. First, a measured diffraction spectrum of a 2-D array overlay target to be measured is measured. Then, a deviation of the measured diffraction spectrum of the 2-D array overlay target to be measured is calculated. Next, a matching process is performed to find a matched deviation in a database, wherein the database stores deviations of simulated diffraction spectra of a plurality of 2-D array overlay targets and corresponding overlay errors thereof. Finally, an overlay error of the 2-D array overlay target to be measured is determined in accordance with the matched deviation.

A system for measuring overlay error according to another embodiment of the present disclosure is disclosed. The system includes an angular scatterometer, a data processing module, a database and a matching unit. The angular scatterometer is utilized to acquire a measured spectrum of a 2-D array overlay target to be measured. In accordance with the measured spectrum, the data processing module is configured to perform the step of obtaining a signal difference value for each corresponding angle pair at either side of a zero degree scan angle, so as to calculate the deviation of the measured diffraction spectrum for the 2-D array overlay target to be measured. The database is utilized to store deviations of simulated diffraction spectra of a plurality of 2-D array overlay targets and corresponding overlay errors thereof. The matching unit is utilized to compare the deviations of the simulated diffraction spectra in the data base with the deviation of the measured diffraction spectrum calculated by the data processing module, so as to obtain a matched overlay error.

BRIEF DESCRIPTION OF THE SEVERAL VIEWS OF THE DRAWINGS

The accompanying drawings, which are incorporated in and constitute a part of this specification, illustrate embodiments of the disclosure and, together with the description, serve to explain the principles of the disclosure.

DETAILED DESCRIPTION OF THE INVENTION

One primary feature of the present disclosure is the application of the deviation of the simulated diffraction spectrum of a two-dimensional array overlay target including two 2-D array gratings. In one aspect, the present disclosure eliminates strong correlation problems among structural parameters. In another aspect, the present disclosure generates enough theoretical model-based data to reduce the work of fabricating overlay targets on a semiconductor wafer and measuring the diffraction spectra formed by the overlay targets.

Figure 1:
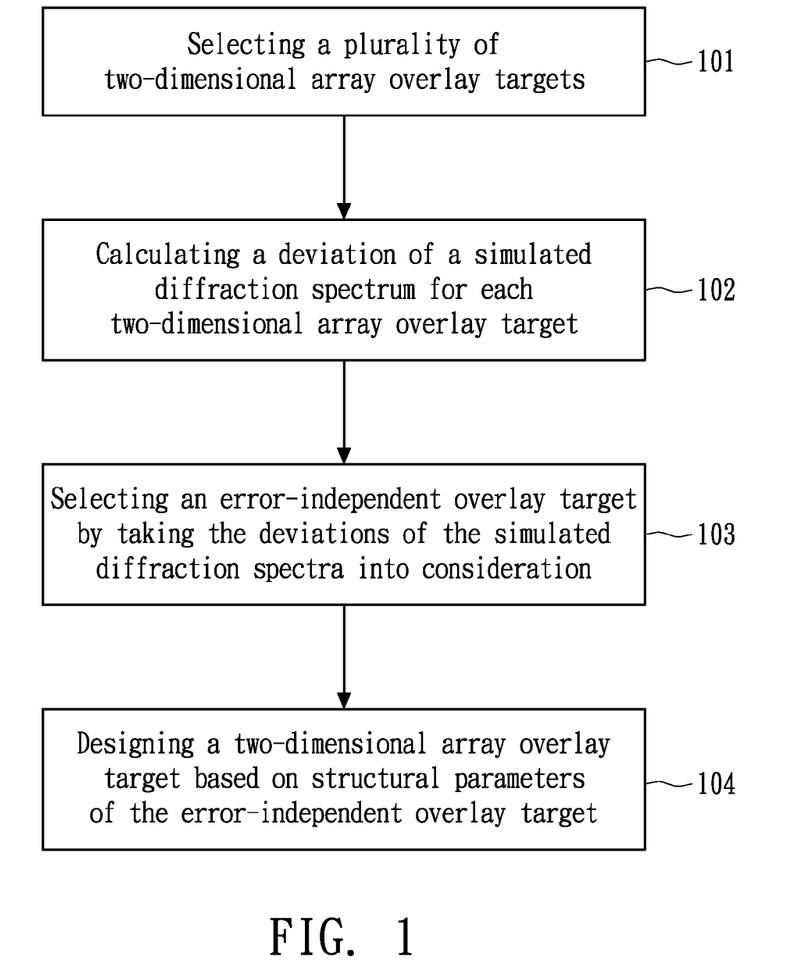
FIG. 1 shows a schematic view of a method for designing a 2-D array overlay target according to an embodiment of the present disclosure.

FIG. 1 shows a flowchart of a method for designing a 2-D array overlay target according to an embodiment of the present disclosure. First, in step 101, a plurality of 2-D array overlay targets having different overlay errors are selected. In step 102, a deviation of a simulated diffraction spectrum for each 2-D array overlay target is calculated. Next, in step 103, an error-independent overlay target is selected by taking the deviations of the simulated diffraction spectra into consideration. Finally, in step 104, a 2-D array overlay target is designed based on structural parameters of the error-independent overlay target.

More detailed descriptions of the above steps are provided in FIGS. 2-10. The embodiment, in summary, generates a simulated diffraction spectrum according to each 2-D array overlay target, then generates a graph having spectrum difference curves based on the deviations and the overlay errors, and finally designs a 2-D array overlay target by analyzing correlations between the deviations and the overlay errors in accordance with the graph.

Figure 2A:
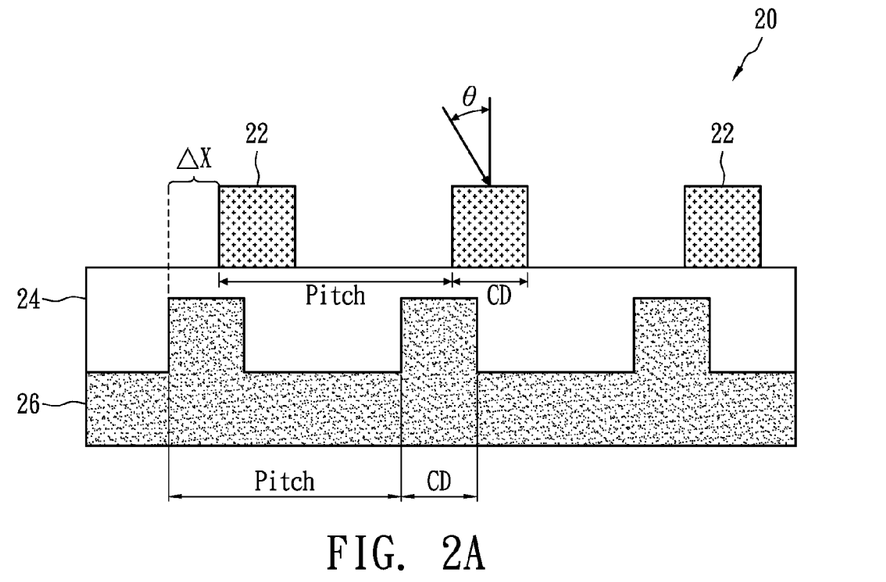
FIG. 2A shows a side view of a 2-D array overlay target.
Figure 2B:
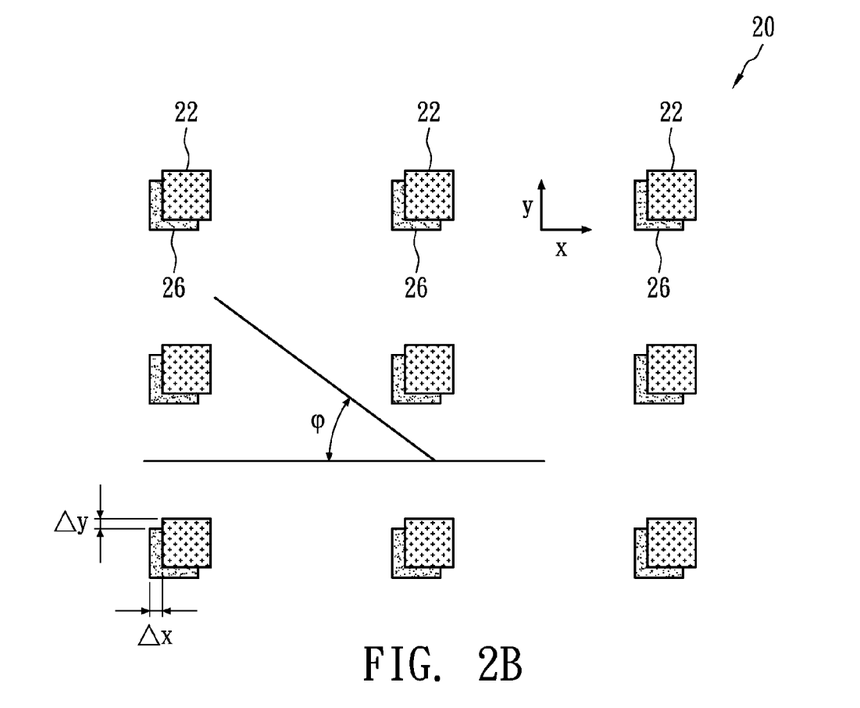
FIG. 2B shows a top view of a 2-D array overlay target.

FIGS. 2A and 2B show, respectively, a side view and a top view of a 2-D array overlay target. The 2-D array overlay target 20 comprises an upper 2-D array grating 22, a medium layer 24 and a lower 2-D array grating 26. Both the upper 2-D array grating 22 and the lower 2-D array grating 26 have the same structural parameters, but the overlay errors ($\Delta x$ and $\Delta y$) in the x-axis direction and the y-axis direction are different. For example, both 2-D array gratings 22 and 26 have the same grating pitch, critical dimension line width and sidewall angle. However, the overlay errors in the x-axis direction and in the y-axis direction are $\Delta x$ and $\Delta y$, respectively. Once the structural parameters, overlay errors ($\Delta x$ and $\Delta y$) of a 2-D array overlay target are determined, a spectrum of the 2-D array overlay target can be simulated with a rigorous coupled-wave theory (RCWT). In accordance with an exemplary embodiment of the present disclosure, setting the azimuth angle of θ to 0 degrees, simulated diffraction spectra of different overlay errors ($\Delta x=\Delta y=0$ nm, 20 nm, 40 nm, 60 nm, 80 nm, 100 nm, 120 nm, 140 nm, 160 nm, 180 nm and 200 nm) can be obtained by varying the incident angle from −50 degrees to 50 degrees.

Figure 3:
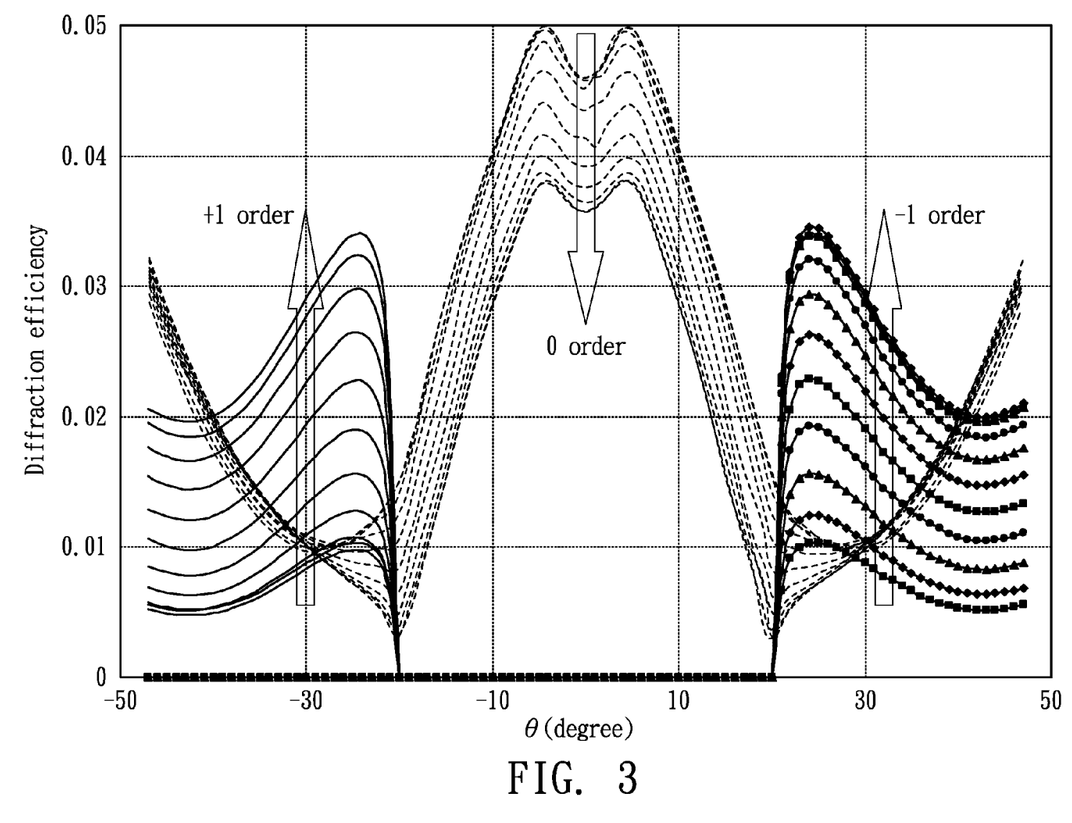
FIG. 3 shows a graphical view with simulated diffraction spectra.

FIG. 3 shows a graph having simulated diffraction spectra, which include 0 order simulated diffraction spectra, +1 order simulated diffraction spectra and −1 order simulated diffraction spectra. In accordance with an exemplary embodiment, the +1 order simulated diffraction spectra can be used by a designer to obtain a deviation of a simulated diffraction spectrum for each 2-D array overlay target. In this exemplary embodiment, the deviation is a root mean square error (RMSE) value.

Figure 4:
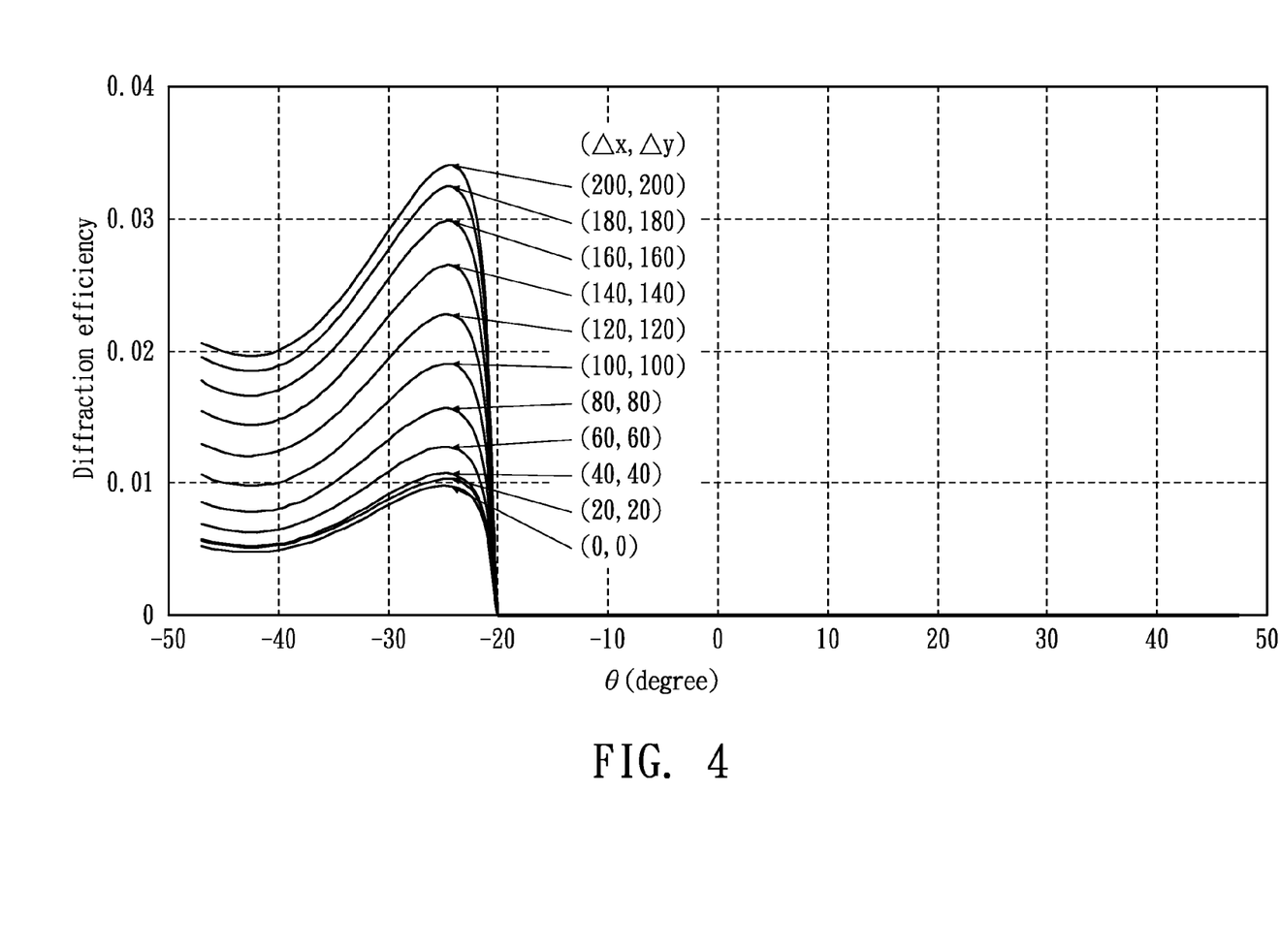
FIG. 4 is a graphical view showing the +1 order simulated diffraction spectra in FIG. 3.

FIG. 4 shows the +1 order simulated diffraction spectra in FIG. 3. In FIG. 4, different curves represent simulated diffraction spectra with different $\Delta x$ and $\Delta y$ values. For each simulated diffraction spectrum, a signal difference value for each corresponding angle pair at either side of a zero degree scan angle is obtained, so as to calculate the RMSE value for each simulated diffraction spectrum. The signal difference values of corresponding angle pairs are, for example, the signal difference value of +50 degrees and −50 degrees, the signal difference value of +49 degrees and −49 degrees, ..., the signal difference value of +2 degrees and −2 degrees, and the signal difference value of +1 degree and −1 degree. Therefore, an RMSE value can be obtained in accordance with each simulated diffraction spectrum.

Figure 5:
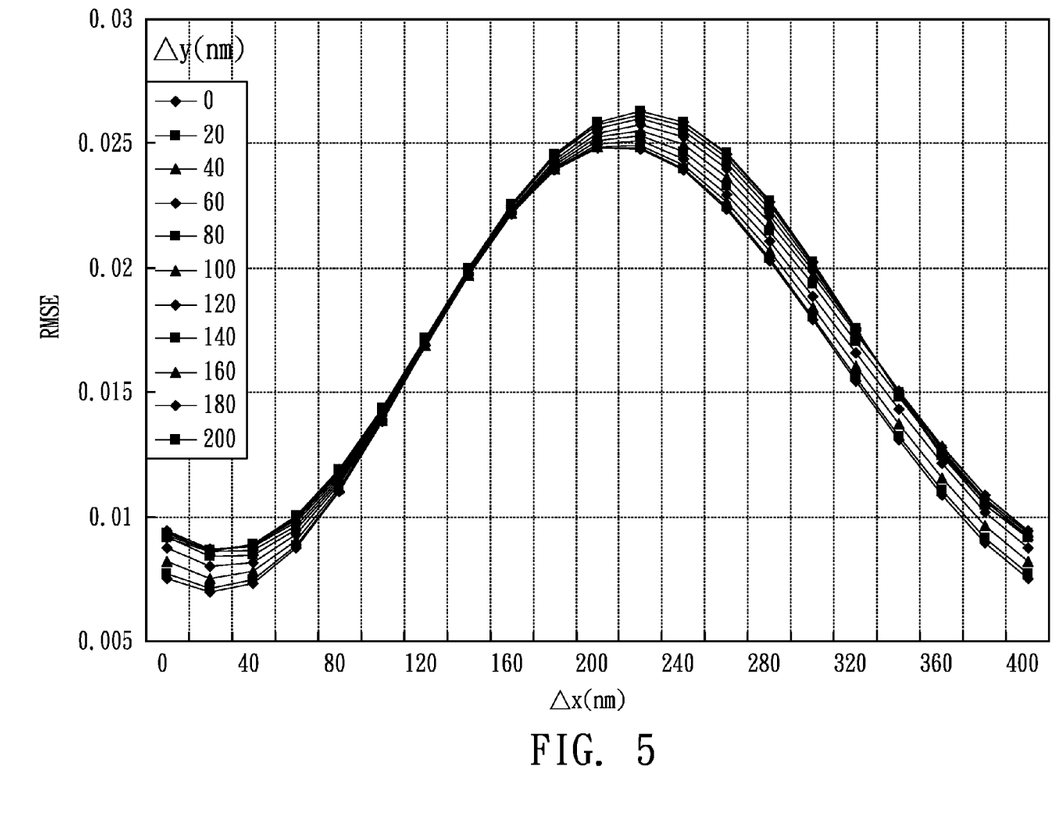
FIG. 5 is a graphical view showing RMSE value as a function of $\Delta x$.

In order to provide further detail, FIG. 5 shows a diagram of RMSE value as a function of $\Delta x$ under the condition of specific values of $\Delta y$ (0 nm, 20 nm, 40 nm, 60 nm, 80 nm, 100 nm, 120 nm, 140 nm, 160 nm, 180 nm and 200 nm). According to the curves in FIG. 5, the RMSE exhibits linear and overlap characteristics as $\Delta x$ varies between 80 nm and 180 nm. This group of curves clearly indicates the measurement correlation between $\Delta x$ and $\Delta y$ is nearly zero.

Figure 6:
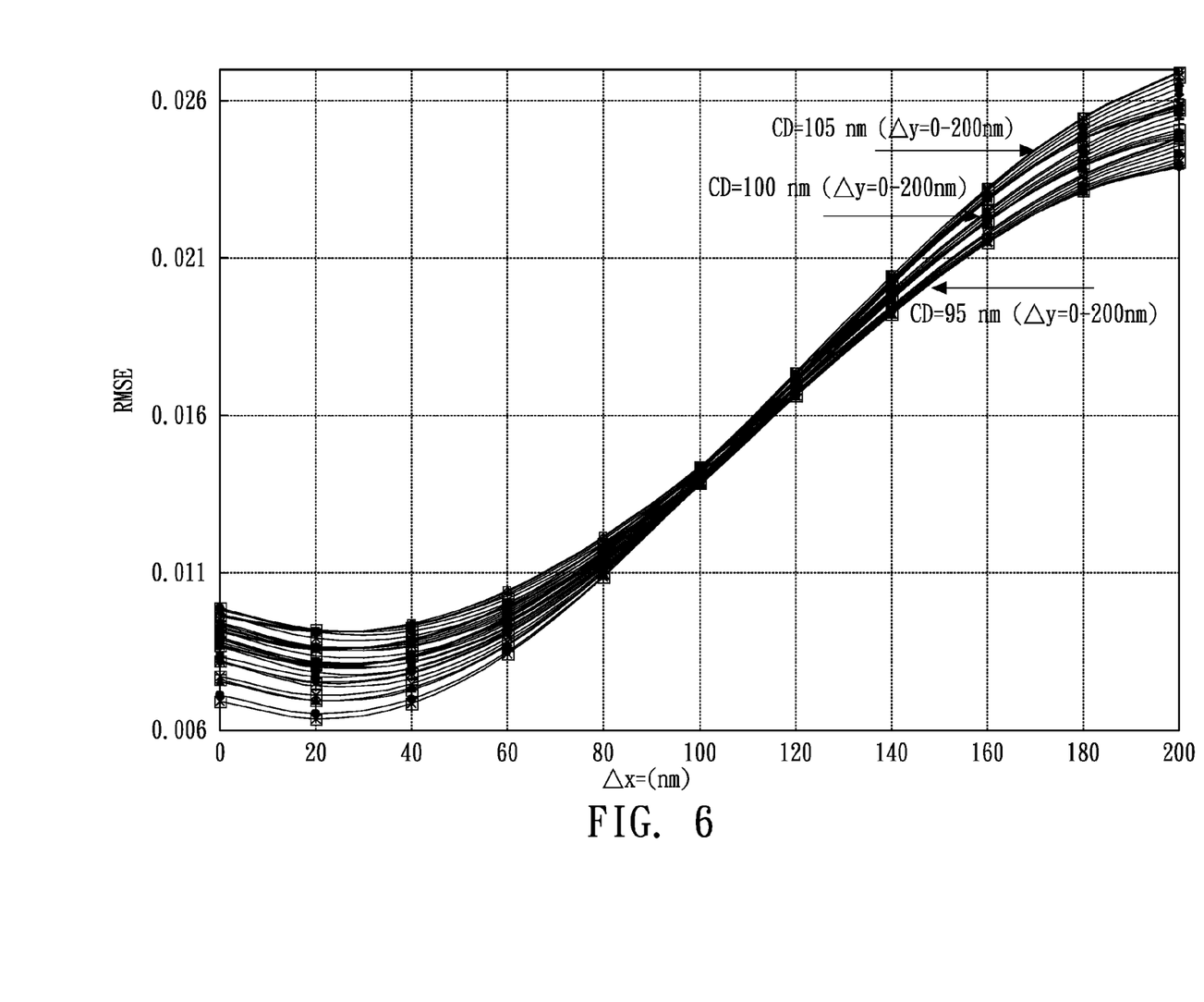
FIG. 6 is a graphical view showing another diagram of RMSE value as a function of $\Delta x$.

Further, FIG. 6 shows a diagram of RMSE value as a function of $\Delta x$ under the conditions of the specific values of $\Delta y$ (0 nm, 20 nm, 40 nm, 60 nm, 80 nm, 100 nm, 120 nm, 140 nm, 160 nm, 180 nm and 200 nm) and the specific critical dimension line width (95 nm, 100 nm and 105 nm). According to the curves in FIG. 6, the RMSE exhibits overlap characteristic as the $\Delta x$ varies between 80 nm and 120 nm. This group of curves clearly indicates the measurement correlation between $\Delta x$ and $\Delta y$ is nearly zero under the condition of different critical dimension line widths caused during the process. Therefore, according to the above-mentioned diagram and the measurement correlation between Δx and Δy, the designer selects an error-independent overlay target in which the overlay errors Δx=Δy=100 nm. Finally, a 2-D array overlay target is designed based on the structural parameters of the error-independent overlay target.

Figure 7:
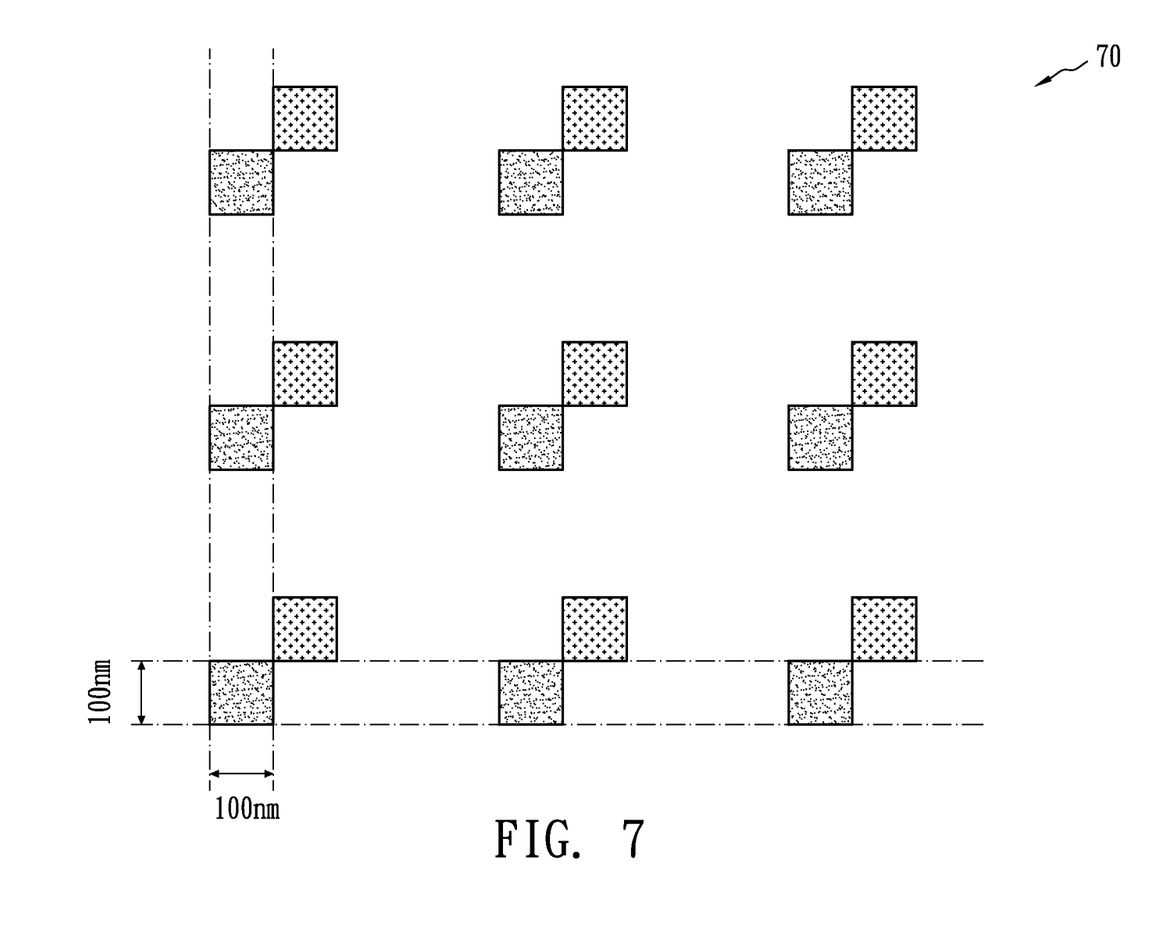
FIG. 7 shows a top view of a designed 2-D array overlay target.

FIG. 7 shows a top view of the designed 2-D array overlay target.

According to another exemplary embodiment, the −1 order simulated diffraction spectra can also be used by the designer to obtain a deviation of a simulated diffraction spectrum for each 2-D array overlay target.

Figure 8:
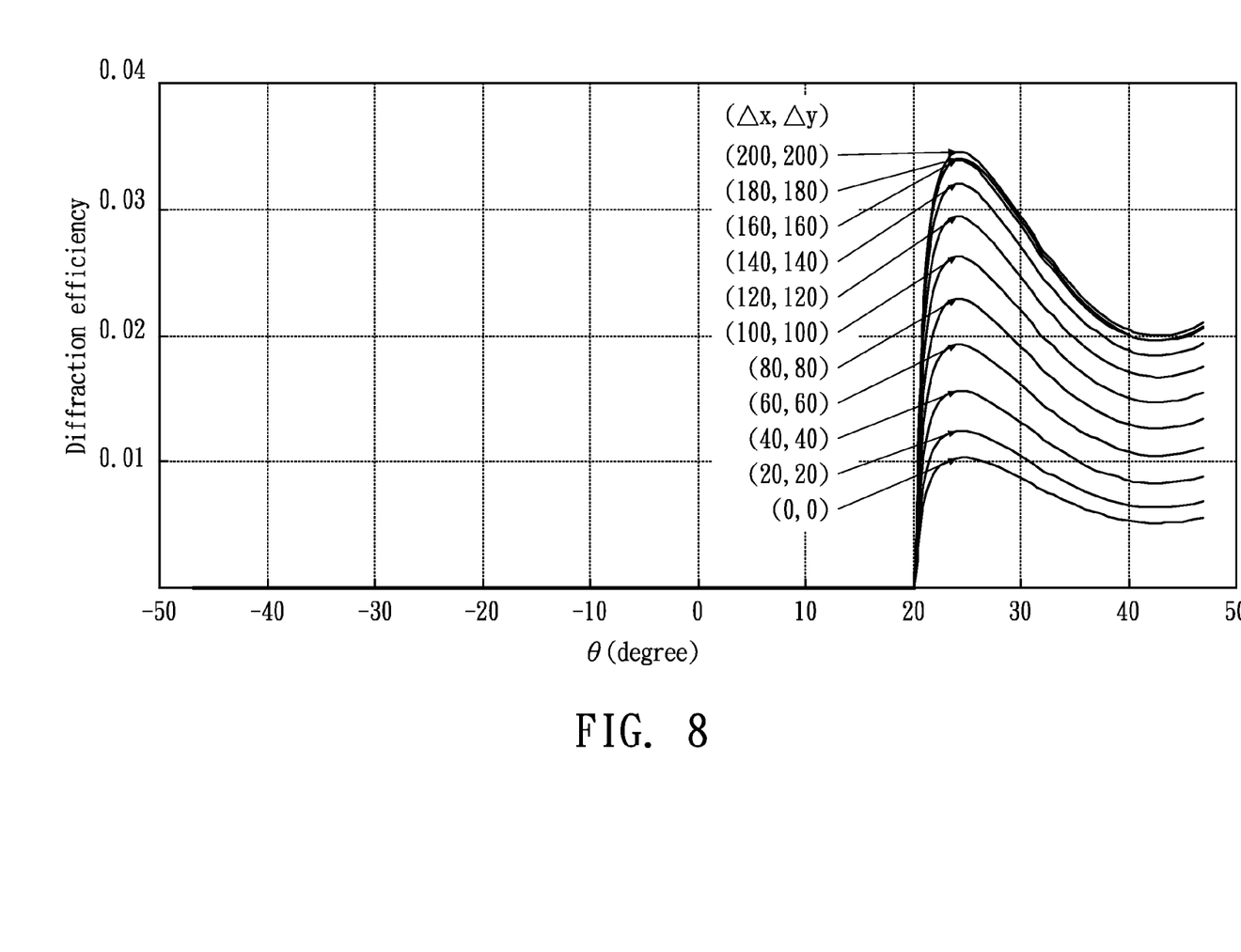
FIG. 8 is a graphical view showing the −1 order simulated diffraction spectra in FIG. 3.

FIG. 8 shows the −1 order simulated diffraction spectra in FIG. 3. In FIG. 8, different curves represent simulated diffraction spectra with different Δx and Δy values. For each simulated diffraction spectrum, a signal difference value for each corresponding angle pair at either side of a zero degree scan angle is obtained, so as to calculate the RMSE value for each simulated diffraction spectrum. Therefore, an RMSE value can be obtained in accordance with each simulated diffraction spectrum.

Figure 9:
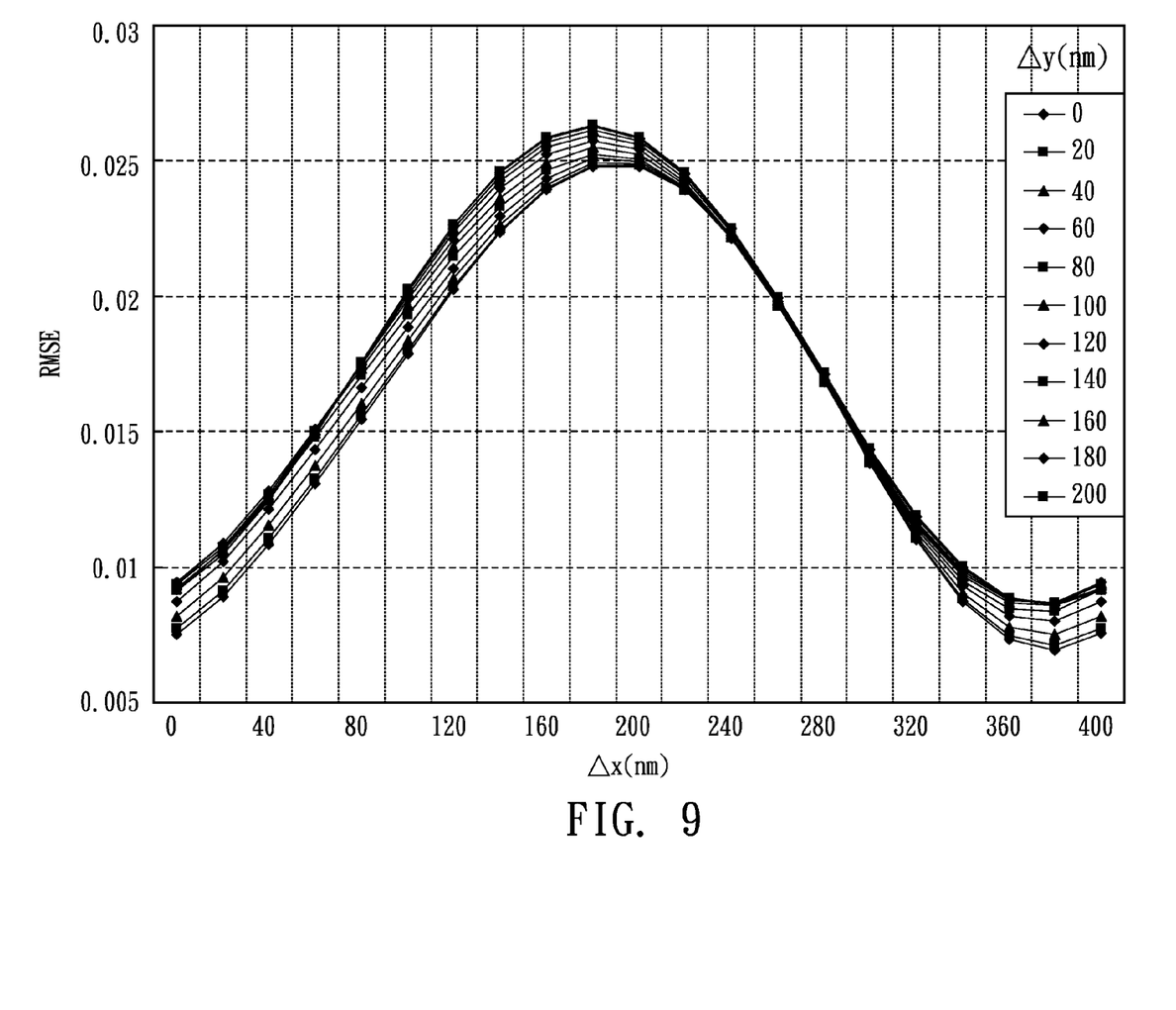
FIG. 9 is a graphical view showing another diagram of RMSE value as a function of $\Delta x$.
Figure 10:
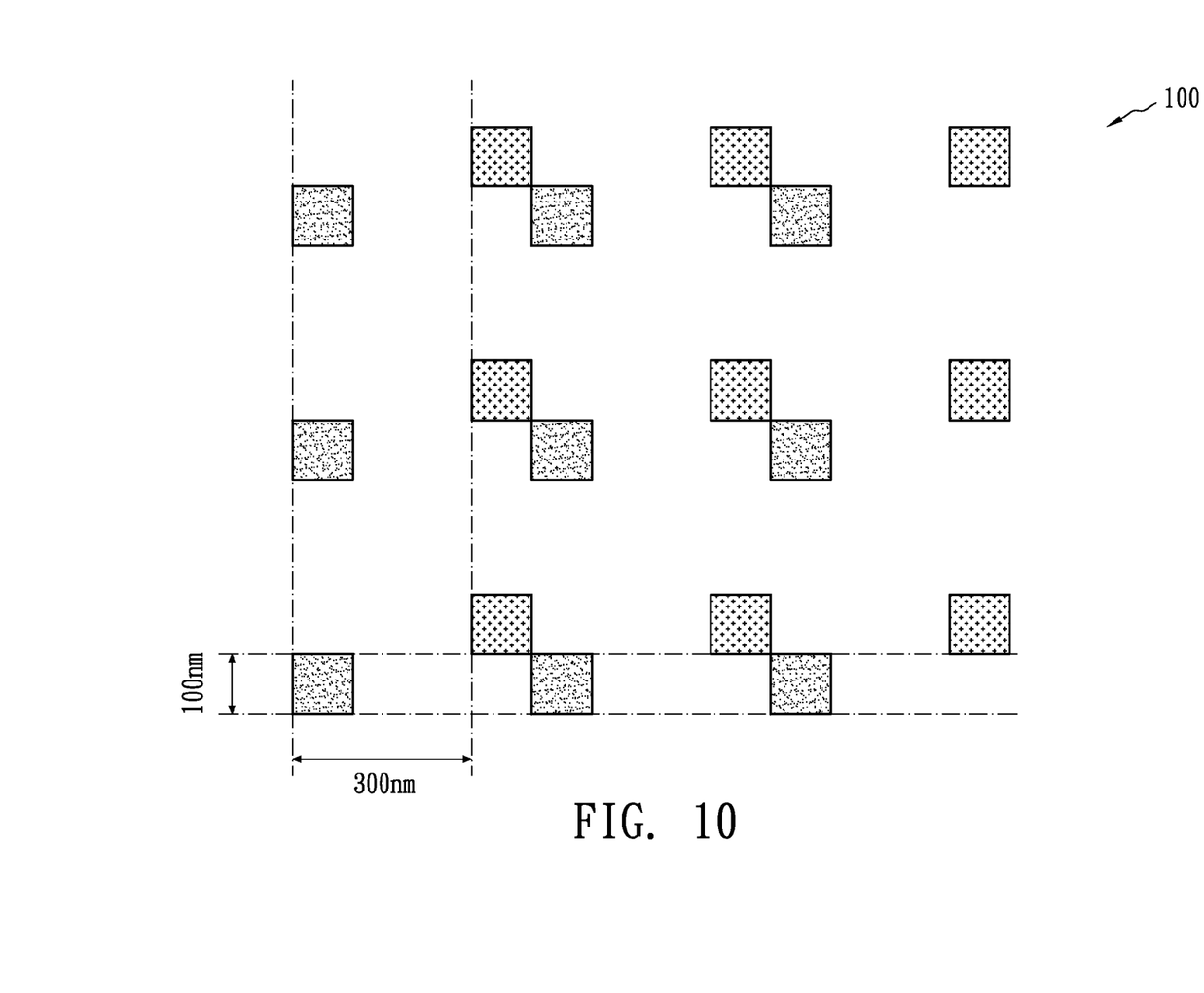
FIG. 10 shows another top view of a designed 2-D array overlay target.

FIG. 9 shows a diagram of RMSE value as a function of Δx under the condition of specific values of Δy (0 nm, 20 nm, 40 nm, 60 nm, 80 nm, 100 nm, 120 nm, 140 nm, 160 nm, 180 nm and 200 nm). According to the curves in FIG. 9, the RMSE exhibits overlap characteristic as Δx varies from 220 nm to 320 nm. This group of curves clearly indicates the measurement correlation between Δx and Δy is nearly zero. Further, the user can obtain a diagram of RMSE value as a function of Δx under the conditions of the specific values of Δy (0 nm, 20 nm, 40 nm, 60 nm, 80 nm, 100 nm, 120 nm, 140 nm, 160 nm, 180 nm and 200 nm) and the specific critical dimension line width (95 nm, 100 nm and 105 nm). Finally, according to the curves in the diagram, the designed 2-D array overlay target is shown in FIG. 10, wherein the overlay errors Δx and Δy are 300 nm and 100 nm respectively.

In addition, if a database stores the RMSE value of the simulated diffraction spectrum for each 2-D array overlay target and their corresponding structural parameters, the RMSE values of the simulated spectra stored in the database can be used to find a matched RMSE value of a measured diffraction spectrum of a 2-D array overlay target to be measured. Then, the overlay error of the measured 2-D array overlay target can be found according to the corresponding overlay target of the matched RMSE value.

Figure 11:
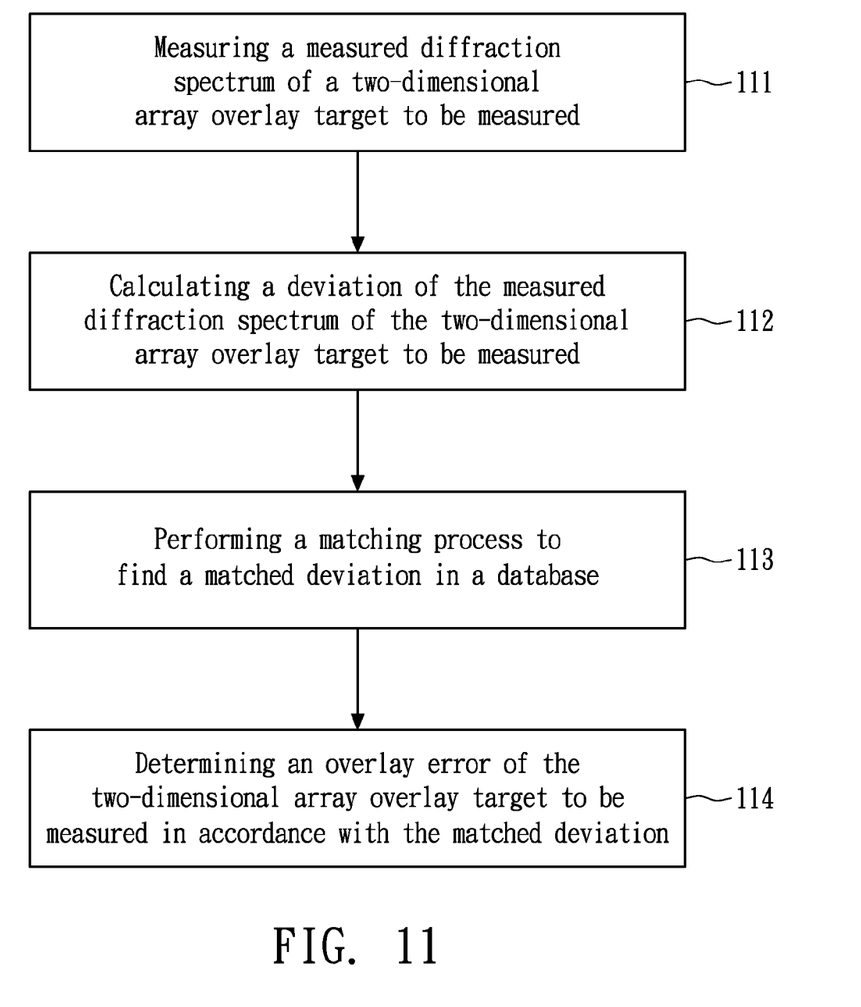
FIG. 11 shows a schematic view of a method for measuring an overlay error according to another embodiment of the present disclosure.

FIG. 11 shows a flowchart of a method for measuring an overlay error according to another embodiment of the present disclosure. First, in step 111, a measured diffraction spectrum of a 2-D array overlay target to be measured is measured. In step 112, a deviation of the measured diffraction spectrum of the 2-D array overlay target to be measured is calculated. The deviation is an RMSE value. The 2-D array overlay target to be measured comprises an upper 2-D array grating, a medium layer and a lower 2-D array grating. Next, in step 113, a matching process is performed to find a matched deviation in a database, wherein the database stores deviations of simulated diffraction spectra of a plurality of 2-D array overlay targets and corresponding overlay errors thereof. Finally, in step 114, an overlay error of the 2-D array overlay target to be measured is determined in accordance with the matched deviation.

To further clarify, the method of establishing a database initially selects the plurality of 2-D array overlay targets, wherein the 2-D array overlay targets have different overlay errors. Then, the deviation of the simulated diffraction spectrum is calculated for each 2-D array overlay target. Each 2-D array overlay target comprises an upper 2-D array grating, a medium layer and a lower 2-D array grating. The upper 2-D array grating and the lower 2-D array grating have the same grating pitch, critical dimension line width and sidewall angle. In addition, the method for calculating the deviation of the simulated diffraction spectrum for each 2-D array overlay target comprises the steps of: generating the simulated diffraction spectrum for each 2-D array overlay target by utilizing a rigorous coupled wave theory; and obtaining a signal difference value for each corresponding angle pair at either side of a zero degree scan angle, so as to calculate the deviation of the simulated diffraction spectrum for each 2-D array overlay target. The simulated diffraction spectrum is a +1 order simulated diffraction spectrum or a −1 order simulated diffraction spectrum.

Figure 12:
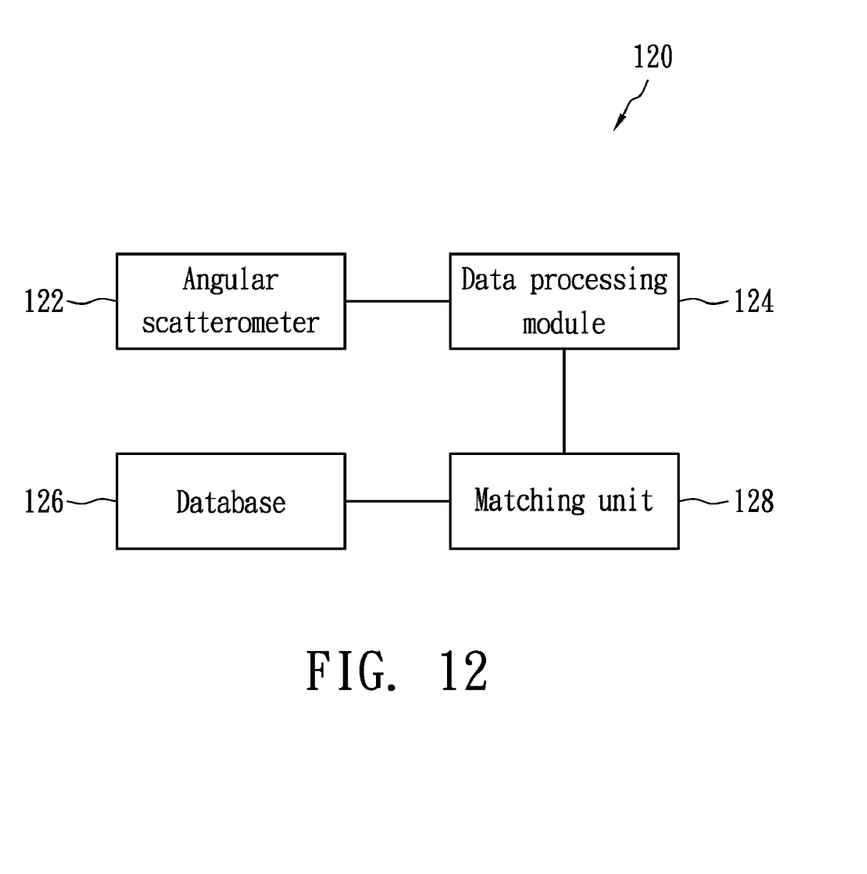
FIG. 12 shows a schematic view of a system for measuring overlay errors according to another exemplary embodiment of the present disclosure.

FIG. 12 illustrates a system for measuring overlay errors according to another exemplary embodiment of the present disclosure. The system 120 includes an angular scatterometer 122, a data processing module 124, a database 126 and a matching unit 128. The angular scatterometer 122 is utilized to acquire a measured spectrum of a 2-D array overlay target to be measured. The 2-D array overlay target to be measured comprises an upper 2-D array grating, a medium layer and a lower 2-D array grating. The data processing module 124 is utilized to perform the step of obtaining a signal difference value for each corresponding angle pair at either side of a zero degree scan angle, so as to calculate the deviation of the measured diffraction spectrum for the 2-D array overlay target to be measured. The deviation is an RMSE value. The database 126 is utilized to store deviations of simulated diffraction spectra of a plurality of 2-D array overlay targets and corresponding overlay errors thereof. The plurality of 2-D array overlay targets have different overlay errors while each 2-D array overlay target comprises an upper 2-D array grating structure and a lower 2-D array grating structure. The upper 2-D array grating structure and the lower 2-D array grating structure have the same grating pitch, critical dimension line width and sidewall angle. The method of establishing the database 126 is same as the method of establishing the database mentioned above. The matching unit 124 is utilized to compare the deviations of the simulated diffraction spectra in the database 126 with the deviation of the measured diffraction spectrum calculated by the data processing module 124, so as to obtain an overlay error of the 2-D array overlay target to be measured.

The above-described exemplary embodiments are intended to be illustrative of the disclosure principle only. Those skilled in the art may devise numerous alternative embodiments without departing from the scope of the following claims.

We claim:

1. A method for designing a two-dimensional array overlay target for a wafer, comprising the steps of:
   selecting a plurality of two-dimensional array overlay targets having different overlay errors;
   calculating deviations of simulated diffraction spectra for the two-dimensional array overlay targets;
   selecting an error-independent overlay target by taking the generated deviations of the simulated diffraction spectra into consideration; and
   designing using a computer a two-dimensional array overlay target based on structural parameters of the selected error-independent overlay target.

2. The method of claim 1, wherein each two-dimensional array overlay target comprises a first two-dimensional array grating structure and a second two-dimensional array grating structure.

3. The method of claim 2, wherein the first two-dimensional array grating structure and the second two-dimensional array grating structure have the same grating pitch, critical dimension line width and sidewall angle.

4. The method of claim 1, wherein the step of calculating the deviations of the simulated diffraction spectra for the two-dimensional array overlay targets comprises the steps of:
   generating the simulated diffraction spectrum for each two-dimensional array overlay target; and
   obtaining a signal difference value for each corresponding angle pair at either side of a zero degree scan angle, so as to calculate the deviation of the simulated diffraction spectrum for each two-dimensional array overlay target.

5. The method of claim 4, wherein a rigorous coupled wave theory is utilized for generating the simulated diffraction spectrum for each two-dimensional array overlay target.

6. The method of claim 4, wherein the simulated diffraction spectrum is a +1 order simulated diffraction spectrum or a −1 order simulated diffraction spectrum.

7. The method of claim 1, wherein the step of selecting the error-independent overlay target by taking the generated deviations of the simulated diffraction spectra into consideration comprises the steps of:
   generating a graph having a plurality of spectrum difference curves in accordance with the deviations of the simulated diffraction spectra of the two-dimensional array overlay targets having overlay errors; and
   selecting the error-independent overlay target by analyzing correlations of the generated deviations and the overlay errors in accordance with the graph having the plurality of spectrum difference curves.

8. The method of claim 1, wherein the deviation is a root mean square error value.

* * * * *